United States Patent [19]

Heeringa et al.

[11] Patent Number: 5,412,332
[45] Date of Patent: May 2, 1995

[54] DRIVE CIRCUIT FOR A FLYBACK CONVERTER WITH SWITCHING TRANSISTORS IN BRIDGE ARRANGEMENT

[75] Inventors: Schelte Heeringa; Geert J. Bosscha, both of Drachten, Netherlands

[73] Assignee: U. S. Philips Corporation, New York, N.Y.

[21] Appl. No.: 128,979

[22] Filed: Sep. 29, 1993

[30] Foreign Application Priority Data

Oct. 2, 1992 [EP] European Pat. Off. ............ 92203026

[51] Int. Cl.⁶ ............................................. H03K 3/00
[52] U.S. Cl. ..................................... 327/110; 327/494; 327/588
[58] Field of Search ........ 307/270, 257, 263, 570–572, 307/542, 644, 321, 255; 363/19; 327/110, 494, 170, 448, 488

[56] References Cited

U.S. PATENT DOCUMENTS

| | | | |
|---|---|---|---|
| 4,652,984 | 3/1987 | Van Der Akker et al. | 363/18 |
| 4,768,141 | 8/1988 | Hubertus et al. | 363/16 |

FOREIGN PATENT DOCUMENTS 0060929 5/1977 Japan ..................... 363/19

*Primary Examiner*—William L. Sikes
*Assistant Examiner*—James A. Dudek
*Attorney, Agent, or Firm*—Edward Blocker; Laurie E. Gathman

[57] ABSTRACT

A flyback converter including a first (6) and a second (8) switching transistor, a first (10) and a second (12) rectifier diode, and a primary winding (14) of a transformer, which parts are connected in a bridge arrangement. The first switching transistor (6) receives its drive by positive feedback via a secondary winding (30), a coupling capacitor (36) and a series resistor (38, 40). Upon commutation of the voltage on the secondary winding (30) the first switching transistor (6) is turned off, a discharge diode (44) providing a discharge path for the coupling capacitor (36) in order to achieve that the first switching transistor (6) is turned on more rapidly in the next switching cycle. However, the discharge diode (44) limits the cut-off voltage on the control electrode of the first switching transistor (6), so that turning off proceeds comparatively slowly. This effect is eliminated by a voltage source (46, 48, 52) and a further switching transistor (54) which is turned on upon commutation. The further switching transistor (54) then produces a higher cut-off voltage on the control electrode of the first switching transistor (6), as a result of which the first switching transistor (6) is turned off more rapidly.

16 Claims, 2 Drawing Sheets

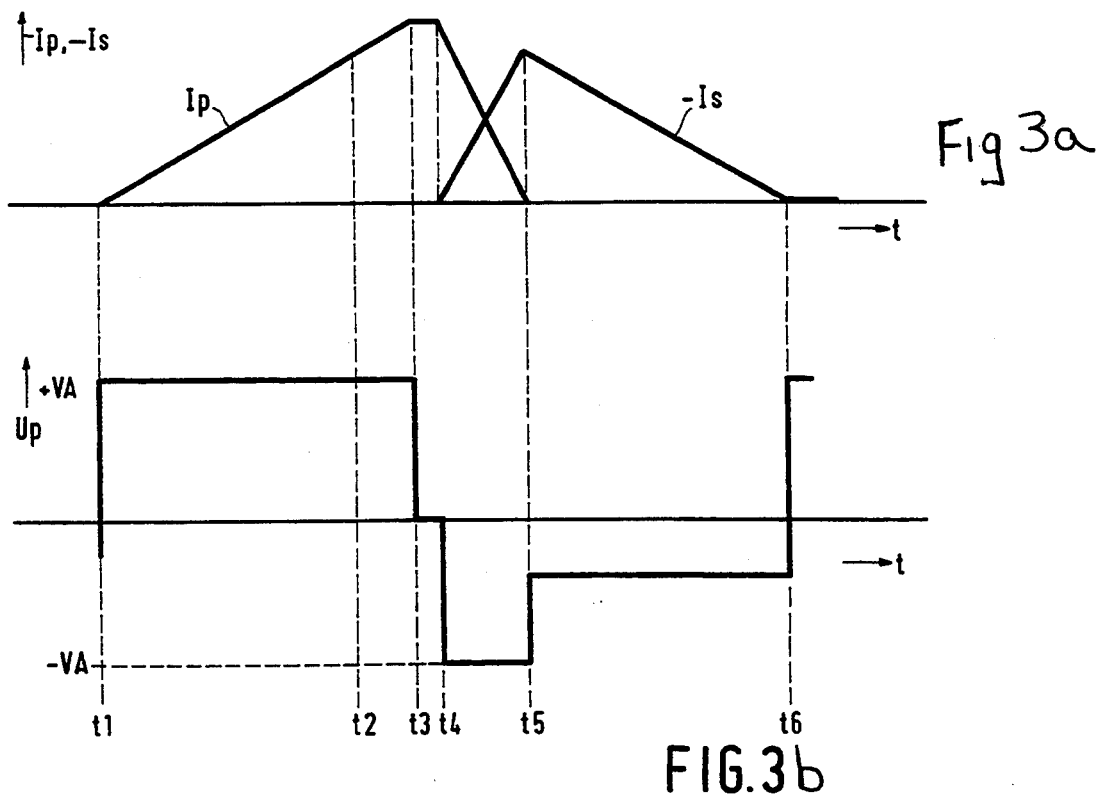
FIG. 3a
FIG. 3b
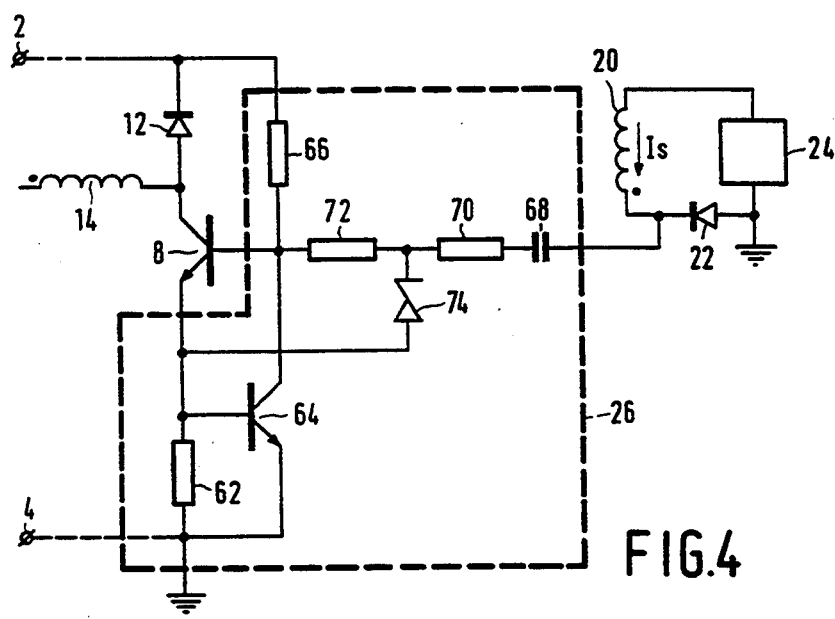
FIG. 4

DRIVE CIRCUIT FOR A FLYBACK CONVERTER WITH SWITCHING TRANSISTORS IN BRIDGE ARRANGEMENT

FIELD OF THE INVENTION

The invention relates to a drive circuit for driving a control electrode of a switching transistor having a main current path in series with a primary winding of a transformer connected between a first and a second power supply terminal, which drive circuit comprises:
- a starting resistor connected between the control electrode of the switching transistor and the first power supply terminal,
- a secondary winding of the transformer having a first terminal and a second terminal, which second terminal is connected to a first main electrode of the switching transistor in a node,
- a coupling capacitor and a series resistor, which are connected in series between the first terminal of the secondary winding and the control electrode of the switching transistor, and
- a discharge diode connected between the second terminal of the secondary winding and a tap of the series resistor.

The invention further relates to a power supply circuit with two switching transistors in bridge arrangement, comprising such a drive circuit.

BACKGROUND OF THE INVENTION

A drive circuit of the type defined in the opening paragraph is known from U.S. Pat. No. 4,652,984. This known drive circuit is used in a flyback converter, the connection from the primary of the transformer to the first and the second power supply terminal being interrupted periodically by the switching transistor. The starting resistor causes the switching transistor to be turned on, after which the switching transistor is rapidly driven into saturation by positive feedback via the secondary winding, the coupling capacitor and the series resistance. The switching transistor is turned off as soon as the current through this transistor exceeds a given value. The voltage across the secondary winding commutates, i.e. its polarity changes, and positive feedback via the coupling capacitor and the series resistance helps to turn off the switching transistor. The discharge diode is then conductive and provides a discharging path for the coupling capacitor, which speeds up starting of the switching transistor in the next switching cycle.

The switching transistor and the drive circuit can also be used in a flyback converter comprising two switching transistors in a bridge arrangement. The principle of a bridge arrangement is know from inter alia U.S. Pat. No. 4,768,141, FIG. 1. The bridge arrangement comprises two switching transistors, of which the first one can connect one terminal of the primary to the first power supply terminal and of which the second switching transistor can connect the other terminal of the primary to the second power supply terminal. In order to minimize switching losses the two switching transistors must be driven with maximal synchronism. One switching transistor can then be driven in conventional manner, for example with pulse-width control or in a manner as known from the first-mentioned U.S. Pat. No. 4,652,984 and then forms the master switching transistor. The other switching transistor can then be driven by the afore-mentioned known drive circuit and then forms the slave switching transistor because it is turned on and off by the commutation of the voltage on the secondary winding as a result of the master switching transistor being turned on and off.

A disadvantage is now that the slave switching transistor is turned off comparatively slowly because the discharge diode limits the commutated voltage on the control electrode of this switching transistor to approximately 0.7 V. Moreover, the current required for turning off is limited by that part of series resistance situated between the discharge diode and the control electrode of the slave switching transistor. It is an object of the invention to provide a solution enabling the slave switching transistor to be turned off more rapidly.

SUMMARY OF THE INVENTION

To achieve this, in accordance with the invention, a drive circuit of the type defined in the opening paragraph is characterized in that the drive circuit further comprises:
- a voltage source having a voltage terminal for supplying a bias voltage which relative to the node is higher than and of the same sign as the forward voltage of the discharge diode, and
- a further switching transistor of a conductivity type opposite to the conductivity type of the first-mentioned switching transistor, which further switching transistor has a first main electrode connected to the control electrode of the first-mentioned switching transistor, a second main electrode connected to the voltage terminal and a control electrode coupled to the first terminal of the secondary winding.

The drive circuit comprises a further switching transistor which upon commutation of the voltage on the secondary winding connects the control electrode of the first-mentioned switching transistor to the voltage terminal of the voltage source. Since the voltage of this voltage source is higher than the forward voltage of the discharge diode the first-mentioned switching transistor is turned off more rapidly. Moreover, this eliminates the current-limiting effect of the series resistance.

An embodiment of a drive circuit in accordance with the invention is characterized in that the voltage source comprises: a rectifier diode and a smoothing capacitor, which are arranged in series between the first terminal and the second terminal of the secondary winding, the voltage terminal being formed by a terminal of the smoothing capacitor, which terminal is coupled to the third rectifier diode. The commutated voltage on the secondary winding is simply and advantageously converted into a direct voltage by means of the rectifier diode and the smoothing capacitor and used as a supply voltage for the further switching transistor.

BRIEF DESCRIPTION OF THE DRAWING

These and other aspects of the invention will now be described and clarified with reference to the accompanying drawings, in which FIG. 3a and 3b are diagrams illustrating the operation of a power supply circuit in bridge arrangement comprising a drive circuit in accordance with the invention, and FIG. 4 is a circuit diagram of a supplementary circuit for use in a power supply circuit in bridge arrangement comprising a drive circuit in accordance with the invention.

In these Figures parts or elements having the same function or purpose bear the same references.

DETAILED DESCRIPTION OF THE PREFERRED EMBODIMENTS

Figure 1:
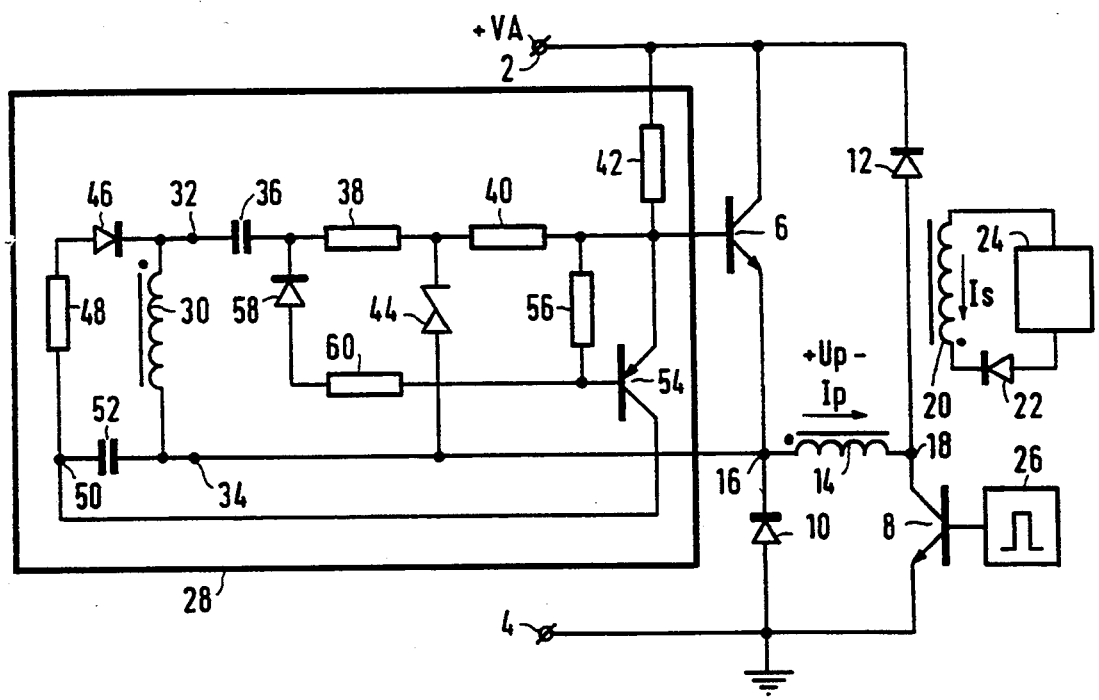
FIG. 1 is a circuit diagram of a power supply circuit in bridge arrangement with a drive circuit in accordance with the invention.
Figure 2:
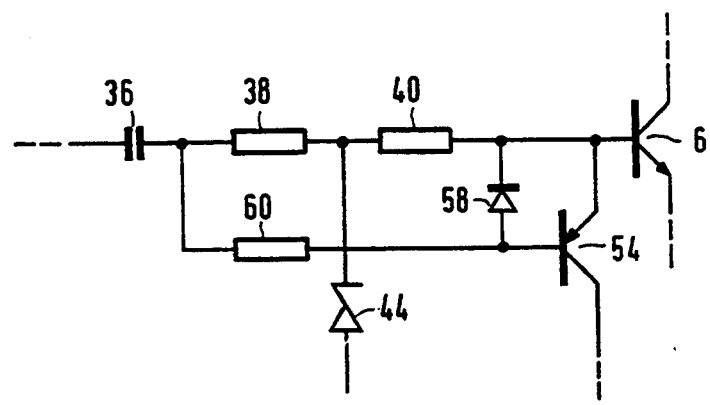
FIG. 2 is a circuit diagram of a part of an alternative drive circuit in accordance with the invention.

FIG. 1 shows a power supply circuit in accordance with the invention. Between a positive power supply terminal 2 and a negative power supply terminal 4, which is connected to earth, the following parts are connected in a bridge arrangement: a first switching transistor 6, a second switching transistor 8, a first rectifier diode 10, a second rectifier diode 12 and a primary winding 14 of a transformer which is not shown as such. The switching transistors 6 and 8 are constructed as, for example, bipolar NPN transistors. The anode of the first rectifier diode 10 is connected to the negative power supply terminal 4. The emitter or first main electrode of the second switching transistor 8 is, for example, also connected to the negative power supply terminal 4. However, depending on the manner in which this transistor is driven, the emitter may alternatively be connected to the negative power supply terminal 4 via an impedance. The collector or second main electrode of the first switching transistor 6 and the cathode of the second rectifier diode 12 are connected to the positive power supply terminal 2. The emitter of the first switching transistor 6 and the cathode of the first rectifier diode 10 are connected to one another in a first node 16. The cathode of the second rectifier diode 12 and the collector of the second switching transistor 8 are connected to one another in a second node 18. The primary winding is connected between the nodes 16 and 18. The transformer comprises a first secondary winding 20 to which a load 24 is connected via a rectifier diode 22. The cathode of the rectifier diode 22 is connected to that end of the secondary winding 20 which carries a voltage in phase with the voltage on the first node 16. The base or control electrode of the second switching transistor 8 receives its drive from a drive circuit 26 of arbitrary construction. The first switching transistor 6 receives its drive from a drive circuit 28 whose parts are arranged as follows. A second secondary winding 30 of the transformer has a first terminal 32 and a second terminal 34, which second terminal 34 is connected to the first node 16. Alternatively, the secondary winding 30 may be a tap of the primary winding 14. The voltage on the first terminal 32 is in phase with the voltage on the first junction 16. The first terminal 32 is connected to the base or control electrode of the first switching transistor 6 via a coupling capacitor 36 and two series resistors 38 and 40, said base being also connected to the positive power supply terminal 2 via a starting resistor 42. A zener diode 44 has its cathode connected to the node between the series resistors 38 and 40 and has its anode connected to the first node 16. A rectifier diode 46 has its cathode connected to the first terminal 32 of the secondary winding 30 and has its anode connected to a voltage terminal 50 via an optional limiting resistor 48. The voltage terminal 50 is connected to the second terminal 34 of the secondary winding 30 via a smoothing capacitor 52. The emitter and the collector of a third bipolar PNP switching transistor 54 are connected to the base of the first switching transistor 6 and the voltage terminal 50 respectively. The base-emitter junction of the third switching transistor 54 is shunted by a resistor 56. The base of the third switching transistor 54 is connected to the node between the coupling capacitor 36 and the series resistor 38 via a series arrangement of a diode 58 and a resistor 60, the anode of the diode 58 being situated at the side of the base of the third switching transistor 54. FIG. 2 shows an alternative circuit arrangement in which the diode 58 takes the place of the resistor 56 and the resistor 60 is connected between the base of the third switching transistor 54 and the node between the coupling capacitor 36 and the series resistor 38.

The operation of the power supply circuit will now be explained with reference to FIG. 3, in which FIG. 3a shows the current Ip through the primary winding 14 and the current —Is through the first secondary winding 20 and FIG. 3b shows the voltage Up across the primary winding 14 as a function of time. At the instant t1 the first switching transistor 6 and the second switching transistor 8 are turned on. Substantially the entire supply voltage +VA then appears across the primary winding 14 and the current Ip increases as a linear function of time. At the instant t2 the drive circuit 26 turns off the second switching transistor 8. Briefly after this, at the instant t3, the second switching transistor is really turned off, so that the voltage Up across the primary winding 14 is commutated, i.e. its sign is reversed. As a result of this commutation the first switching transistor 6 is also turned off via the secondary winding. For a short time interval t3–t4 the current Ip flows through the main current path of the first switching transistor 6 and the second rectifier diode 12. The voltage Up across the primary winding 14 is then substantially zero. If the first switching transistor 6 is fully cut off at the instant t4 the voltage Up is commutated again to a value +VA. Now a current —Is is built up in the secondary winding 20 and via the rectifier diodes 10 and 12 the current Ip decreases to zero. At the instant t5 commutation has ceased, after which the current —Is decreases again to zero at the instant t6 in a manner which depends on the type of load 24. At the instant t6 all the energy has been drawn from the transformer and the voltages across the windings become zero. After this, the switching transistors 6 and 8 are turned on again.

Conduction of the first switching transistor 6 is initiated by means of the starting resistor 42. When the two switching transistors 6 and 8 have been turned on the positive supply voltage +VA will appear across the primary winding 14. Owing to the positive feedback via the secondary winding 30, the coupling capacitor 36 and the series resistors 38 and 40 the base of the first switching transistor 6 receives an extra positive drive signal, as a result of which the first switching transistor 6 is rapidly saturated. The series resistors 38 and 40 limit the base current of the first switching transistor 6 and the zener diode 44 precludes oversaturation when the supply voltage VA is large. The zener diode 44 may be replaced by a normal diode if this situation does not occur in practice. Upon the commutation at the instant t3 the voltage across the secondary winding 30 first becomes zero and then goes negative, so that the first switching transistor is turned off. The zener diode 44 now functions as a discharge diode for the coupling capacitor 36, as a result of which the first switching transistor 6 is turned on more rapidly in the next switching cycle. However, the negative voltage on the base of the first switching transistor 6 is then limited to −0.7V. Therefore, turning-off takes a comparatively long time, particularly because the current which can be drawn from the base is also limited by the resistor 40. In the time interval 14–16 the voltage on the first terminal 32 is negative relative to the voltage on the second terminal 34. The smoothing capacitor 52 is charged to a negative voltage via the rectifier diode 46 and the optional limiting resistor 48. The base of the third switching transistor 54 receives a negative drive signal via the coupling capacitor 36, the diode 58 and the resistor 60 and the transistor is turned on. The third switching transistor 54 pulls the base of the first switching transistor 6 towards a negative voltage below −0.7V, as a result of which the first switching transistor 6 is turned off rapidly. The diode 58 prevents the third switching transistor 54 from being driven in the interval t1-t4, whilst the resistor 56 keeps the base-emitter junction of the third switching transistor cut off. The alternative circuit shown in FIG. 2 has the same effect.

FIG. 4 shows a more detailed circuit diagram of a drive circuit 26 for the second switching transistor 8. The emitter of the second switching transistor 8 is connected to earth by a resistor 62. The base-emitter junction of a fourth switching transistor 64 is connected in parallel with the resistor 62, the emitter being connected to earth. The collector of the fourth switching transistor 64 is connected to the base of the second switching transistor 8, which base is further connected to the positive power supply terminal 2 via a starting resistor 66. The node between the first secondary winding 20 and the rectifier diode 22 is connected to the base of the second switching transistor 8 via a series arrangement of a coupling capacitor 68, a series resistor 70 and a series resistor 72. The node between the series resistors 70 and 72 is connected to the emitter of the second switching transistor 8 by means of a zener diode 74.

The starting resistor 66, the coupling capacitor 68, the series resistors 70 and 72 and the zener diode 74 operate in the same way and have the same functions as the respective corresponding elements 42, 36, 38, 40 and 44 of the circuit shown in FIG. 1. As soon as the current through the second switching transistor has reached a certain value the fourth switching transistor 64 is turned on, thereby connecting the base of the second switching transistor 8 to earth. The second switching transistor 8 is turned off, the voltage across the first secondary winding 20 is commutated and the current Is flows to the load 24 via the rectifier diode 22. For the remainder the operation is substantially identical to that of the drive circuit 28 of the first switching transistor 6. Owing to the presence of the resistor 62 and the fourth switching transistor 64 the drive circuit 26 shown in FIG. 4 is self-oscillating.

We claim:

1. A drive circuit for driving a control electrode of a switching transistor having a main current path in series with a primary winding of a transformer connected between a first and a second power supply terminal, which drive circuit comprises:
    a starting resistor connected between the control electrode of the switching transistor and the first power supply terminal,
    a secondary winding of the transformer having a first terminal and a second terminal, which second terminal is connected to a first main electrode of the switching transistor at a first node,
    a coupling capacitor and a series resistor, which are connected in series between the first terminal of the secondary winding and the control electrode of the switching transistor, and
    a discharge diode connected between the second terminal of the secondary winding and a tap of the series resistor, characterized in that the drive circuit further comprises:
    a voltage source having a voltage terminal for supplying a bias voltage which relative to the first node is higher than and of the same sign as the forward voltage of the discharge diode, and
    a further switching transistor of a conductivity type opposite to the conductivity type of the first-mentioned switching transistor, which further switching transistor has a first main electrode connected to the control electrode of the firstmentioned switching transistor, a second main electrode connected to the voltage terminal and a control electrode coupled to the first terminal of the secondary winding.

2. A drive circuit as claimed in claim 1, characterized in that the voltage source comprises: a rectifier diode and a smoothing capacitor, which are arranged in series between the first terminal and the second terminal of the secondary winding, the voltage terminal being formed by a terminal of the smoothing capacitor, which terminal is coupled to the rectifier diode.

3. A drive circuit as claimed in claim 2, characterized in that the control electrode of the further switching transistor is connected to a node between the coupling capacitor and the series resistor via a resistor, and a diode is arranged across the control electrode and the first main electrode of the further switching transistor.

4. A drive circuit as claimed in claim 2, characterized in that the control electrode of the further switching transistor is connected to a node between the coupling capacitor and the series resistor via a series arrangement of a diode and a resistor, and a further resistor is arranged across the control electrode and the first main electrode of the further switching transistor.

5. A drive circuit as claimed in claim 4, characterized in that the discharge diode is a zener diode.

6. A drive circuit as claimed in claim 1, characterized in that the discharge diode is a zener diode.

7. A drive circuit as claimed in claim 2, characterized in that the discharge diode is a zener diode.

8. A drive circuit as claimed in claim 3, characterized in that the discharge diode is a zener diode.

9. A power supply circuit comprising two switching transistors in a bridge arrangement comprising:
    a transformer having a primary winding connected between a first node and a second node;
    a first switching transistor having a conductivity type, a control electrode and a main current path, said main current path connected between a first power supply terminal and the first node and in series with said primary winding of said transformer;
    a second switching transistor having a main current path connected between the second node and a second power supply terminal;
    means for driving a control electrode of the second switching transistor;
    a first unidirectional element connected between the first node and the second power supply terminal;

a second unidirectional element connected between the first power supply terminal and the second node;

a drive circuit for driving the control electrode of the first switching transistor, which drive circuit comprises:

a starting resistor connected between the control electrode of the first switching transistor and the first power supply terminal, a secondary winding of the transformer having a first terminal and a second terminal, which second terminal is connected to a first main electrode of the first switching transistor at the first node, a coupling capacitor and a series resistor, which are connected in series between the first terminal of the secondary winding and the control electrode of the first switching transistor, and a discharge diode connected between the second terminal of the secondary winding and a tap of the series resistor, characterized in that the drive circuit further comprises:

a voltage source having a voltage terminal for suppying a bias voltage which relative to the first node is higher than and of the same sign as a forward voltage of the discharge diode, and a further switching transistor of a conductivity type opposite to the conductivity type of the first switching transistor, said further switching transistor having a first main electrode connected to the control electrode of the first switching transistor, a second main electrode connected to the voltage terminal and a control electrode coupled to the first terminal of the secondary winding.

10. A power supply circuit as claimed in claim 9, characterized in that the voltage source comprises: a rectifier diode and a smoothing capacitor, which are arranged in series between the first terminal and the second terminal of the secondary winding, the voltage terminal being formed by a terminal of the smoothing capacitor, which terminal is coupled to the rectifier diode.

11. A power supply circuit as claimed in claim 10, characterized in that the control electrode of the further switching transistor is connected to a node between the coupling capacitor and the series resistor via a resistor, and a diode is arranged across the control electrode and the first main electrode of the further switching transistor.

12. A power supply circuit as claimed in claim 10, characterized in that the control electrode of the further switching transistor is connected to a node between the coupling capacitor and the series resistor via a series arrangement of a diode and a resistor, and a further resistor is arranged across the control electrode and the first main electrode of the further switching transistor.

13. A power supply circuit as claimed in claim 9, characterized in that the discharge diode is a zener diode.

14. A power supply circuit as claimed in claim 10, characterized in that the discharge diode is a zener diode.

15. A power supply circuit as claimed in claim 11, characterized in that the discharge diode is a zener diode.

16. A power supply circuit as claimed in claim 12, characterized in that the discharge diode is a zener diode.

* * * * *